US012128494B2

(12) United States Patent
Elliot et al.

(10) Patent No.: US 12,128,494 B2
(45) Date of Patent: Oct. 29, 2024

(54) SEMICONDUCTOR PROCESSING EQUIPMENT WITH HIGH TEMPERATURE RESISTANT NICKEL ALLOY JOINTS AND METHODS FOR MAKING SAME

(71) Applicant: WATLOW ELECTRIC MANUFACTURING COMPANY, St. Louis, MO (US)

(72) Inventors: Brent Elliot, Cupertino, CA (US); Guleid Hussen, San Francisco, CA (US); Jason Stephens, San Francisco, CA (US); Michael Parker, Brentwood, CA (US); Alfred Grant Elliot, Palo Alto, CA (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

(21) Appl. No.: 18/317,571

(22) Filed: May 15, 2023

(65) Prior Publication Data

US 2023/0278123 A1 Sep. 7, 2023

Related U.S. Application Data

(63) Continuation of application No. 16/203,562, filed on Nov. 28, 2018, now Pat. No. 11,648,620.

(51) Int. Cl.
*C04B 35/581* (2006.01)
*B23K 1/00* (2006.01)
(Continued)

(52) U.S. Cl.
CPC ............ *B23K 1/0016* (2013.01); *B23K 1/008* (2013.01); *B23K 1/19* (2013.01); *B23K 35/286* (2013.01);
(Continued)

(58) Field of Classification Search
CPC ... C04B 37/003; C04B 37/005; C04B 37/006; C04B 2237/12; C04B 2237/366
See application file for complete search history.

(56) References Cited

U.S. PATENT DOCUMENTS 6,106,960 A * 8/2000 Fujii ...................... B23K 35/30
428/627
2003/0207146 A1* 11/2003 Sasaki ............... H01L 23/49822
428/209

(Continued)

FOREIGN PATENT DOCUMENTS

JP  H08277171 A  10/1996
JP  2013525236 A  6/2013
(Continued)

OTHER PUBLICATIONS

Office Action issued in corresponding Korean Application No. 10-2020-7018791, issued Aug. 30, 2023 and an English translation, 14 pages.

*Primary Examiner* — Alex B Efta
(74) *Attorney, Agent, or Firm* — Burris Law, PLLC

(57) ABSTRACT

A method for the joining of ceramic pieces includes applying a layer of titanium on a first ceramic piece and applying a layer of titanium on a second ceramic piece; applying a layer of nickel on each of the layers of titanium on the first ceramic piece and the second ceramic piece; applying a layer of nickel phosphorous to each of the layers of nickel on the first ceramic piece and the second ceramic piece; assembling the first ceramic piece and the second ceramic piece with the layers of titanium, nickel, and nickel phosphorous therebetween; pressing the layer of nickel phosphorous of the first ceramic piece against the layer of nickel phosphorous of the second ceramic piece; heating the first ceramic piece and the second ceramic piece to a joining temperature in a vacuum; and cooling the first ceramic piece (Continued)

and the second ceramic piece. A hermetic seal is formed between the first ceramic piece and the second ceramic piece.

13 Claims, 18 Drawing Sheets

Related U.S. Application Data

(60) Provisional application No. 62/592,348, filed on Nov. 29, 2017.

(51) Int. Cl.
    B23K 1/008    (2006.01)
    B23K 1/19    (2006.01)
    B23K 35/28    (2006.01)
    B32B 9/00    (2006.01)
    C04B 37/00    (2006.01)
    C04B 37/02    (2006.01)
    H01L 21/67    (2006.01)
    H01L 21/683    (2006.01)
    H01L 21/687    (2006.01)
    B23K 103/00    (2006.01)

(52) U.S. Cl.
CPC ............ *B32B 9/005* (2013.01); *C04B 35/581* (2013.01); *C04B 37/005* (2013.01); *C04B 37/026* (2013.01); *H01L 21/67126* (2013.01); *H01L 21/6833* (2013.01); *H01L 21/68757* (2013.01); *H01L 21/68785* (2013.01); *H01L 21/68792* (2013.01); *B23K 2103/52* (2018.08); *C04B 2235/6581* (2013.01); *C04B 2237/123* (2013.01); *C04B 2237/126* (2013.01); *C04B 2237/127* (2013.01); *C04B 2237/128* (2013.01); *C04B 2237/34* (2013.01); *C04B 2237/343* (2013.01); *C04B 2237/365* (2013.01); *C04B 2237/366* (2013.01); *C04B 2237/368* (2013.01); *C04B 2237/68* (2013.01); *C04B 2237/708* (2013.01); *C04B 2237/72* (2013.01); *C04B 2237/80* (2013.01); *C04B 2237/84* (2013.01)

(56) References Cited

U.S. PATENT DOCUMENTS

| 2015/0108203 A1* | 4/2015 | Elliot | B32B 9/041 228/121 |
| 2015/0287620 A1* | 10/2015 | Elliot | H01L 21/68757 279/128 |
| 2016/0185672 A1* | 6/2016 | Elliot | C04B 35/581 156/89.27 |
| 2017/0368803 A1* | 12/2017 | Nelson | C04B 35/565 |

FOREIGN PATENT DOCUMENTS

| KR | 1020170117046 A | 10/2017 |
| WO | 2011113758 A1 | 9/2011 |

* cited by examiner

SEMICONDUCTOR PROCESSING EQUIPMENT WITH HIGH TEMPERATURE RESISTANT NICKEL ALLOY JOINTS AND METHODS FOR MAKING SAME

CROSS-REFERENCE TO RELATED APPLICATIONS

This application is a continuation of U.S. patent application Ser. No. 16/203,562 filed Nov. 28, 2018, which claims priority to and the benefit of U.S. Provisional Application No. 62/592,348 filed Nov. 29, 2017. The disclosures of the above applications are incorporated herein by reference.

FIELD

The present invention relates to methods for joining together objects, and more particularly to brazing methods for joining ceramic objects.

BACKGROUND

The statements in this section merely provide background information related to the present disclosure and may not constitute prior art.

Semiconductor processing and similar manufacturing processes typically employ thin film deposition techniques such as Chemical Vapor Deposition (CVD), Physical Vapor Deposition (PVD), Vapor Phase Epitaxy (VPE), Reactive Ion Etching, and other processing methods. In CVD processing, as well as in other manufacturing techniques, a substrate such as a silicon wafer is secured within a processing chamber using semiconductor processing equipment, such as a heater or an electrostatic chuck, and exposed to the particular processing conditions of the process. The heater or electrostatic chuck is essentially a pedestal that, in addition to securing the substrate, can in some instances also be used to heat the substrate. Other equipment within the chamber, such as showerheads used to deliver deposition chemicals, are also used in such processes.

As semiconductor processing equipment is exposed to high operating temperatures and corrosive process gasses, and because good thermal conductivity is required for good temperature control, prior art heaters, for example, have been made from a very limited selection of materials, such as aluminum nitride (AlN) ceramic or PBN, silicon dioxide (quartz), graphite, and various metals such as aluminum alloys, nickel alloys, stainless steel alloys, Inconel, etc. Reactive process gasses which are typically used for semiconductor processing, or chamber cleaning, generally react with heaters made with metal alloys. These reactions can produce corrosive by-products and other effects which can be detrimental to the desired process results. Ceramic materials can be much more resistant to reactions with typical process gasses, and to corrosion from reaction by-products. However, ceramic materials can have limited methods of fabrication due to inherent material properties, and have high manufacturing costs.

The manufacture of semiconductor processing equipment using ceramics, such as heaters and electrostatic chucks with a ceramic shaft and a ceramic plate, currently involves hot pressing sub-components to partial density, and then again hot pressing an entire assembly until full density is attained. In this type of manufacture the hot pressing/sintering of a large, complex ceramic piece requires a large physical space, and a multiplicity of sequential sintering steps is required. In the case of manufacture from two or more pieces which have already been pressed to full density, there are also at least two drawbacks. First, after the initial sintering of the major components, these components are typically joined using a liquid phase sintering process to join the major components (in the case of aluminum nitride, for example), which requires high heat, high compressive force, and a significant amount of time in a process oven capable of providing both the high temperatures and the high compressive force. Often the high compressive force applied to a shaft during this sintering to a plate, such as is done in the process of creating a ceramic heater, requires that the annular shaft walls be of thicker cross-sectional thickness than desired in the finished product in order to support these compressive forces. The shaft may then need to be machined down to a final lesser thickness desired to keep heat flow down the shaft to a minimum. Second, the high temperatures involved, as well as high contact pressures, may result in lack of uniformity of components places between ceramic sections. For example, an RF antenna may move somewhat, or otherwise deform or have differing thicknesses, which may result in uneven processing of semiconductor wafers when the processing equipment is used in support of later processes.

U.S. Pat. No. 8,789,743 discloses a method for joining ceramic materials which does address the above-mentioned drawbacks of other prior processes. The method includes using a high purity aluminum brazing material at temperatures which result in good and complete wetting, and hermetic joints without diffusion. A limitation on these joints, however, is that the equipment made using these joints cannot be used at higher temperatures, such as temperatures above 700 C, as that is significantly above the solidus temperature of the aluminum braze material.

What is called for is a joining method for joining ceramic pieces which provides a hermetic seal, and which is able to withstand subsequent exposure to processes run at higher temperatures, above 700 C and higher.

SUMMARY

This section provides a general summary of the disclosure and is not a comprehensive disclosure of its full scope or all of its features.

In one form, the present disclosure provides a method for joining ceramic pieces. The method includes applying a layer of titanium on a first ceramic piece and applying a layer of titanium on a second ceramic piece; applying a layer of nickel on each of the layers of titanium on the first ceramic piece and the second ceramic piece; applying a layer of nickel phosphorous to each of the layers of nickel on the first ceramic piece and the second ceramic piece; assembling the first ceramic piece and the second ceramic piece with the layers of titanium, nickel, and nickel phosphorous therebetween; pressing the layer of nickel phosphorous of the first ceramic piece against the layer of nickel phosphorous of the second ceramic piece; heating the first ceramic piece and the second ceramic piece to a joining temperature in a vacuum; and cooling the first ceramic piece and the second ceramic piece. A hermetic seal is formed between the first ceramic piece and the second ceramic piece.

In variations of this form, which may be implemented individually or in any combination: the layers of nickel phosphorous each comprise about 8-13 wt. % phosphorous; the layers of titanium are applied by sputtering; the layers of nickel are applied by sputtering; the layers of nickel phosphorous are applied by electroless plating; the first ceramic piece and the second ceramic piece are an aluminum nitride material; the layers of titanium are not diffused into each of the first ceramic piece and the second ceramic piece; each of the layers of titanium are about 0.1 microns thick, each of the layers of nickel are about 10 microns thick; each of the layers of nickel phosphorous are about 1,000-2,000 microns thick; the pressing is at about 20 psi in the vacuum at or lower than $5\times10E^{-5}$ Torr, at a temperature of about 880-940° C. for about 1-4 hours to create the hermetic seal, the hermetic seal has a vacuum leak rate of $<1\times10E^{-9}$ sccm He/sec; and a ceramic assembly formed by the method.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 13A:
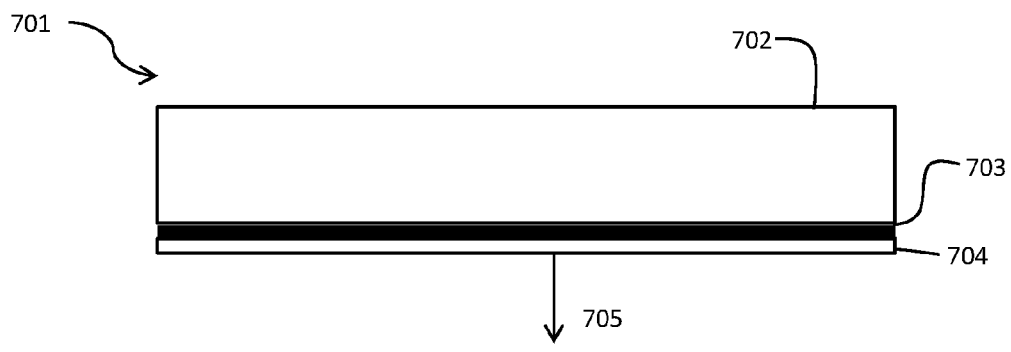
Figure 13B:
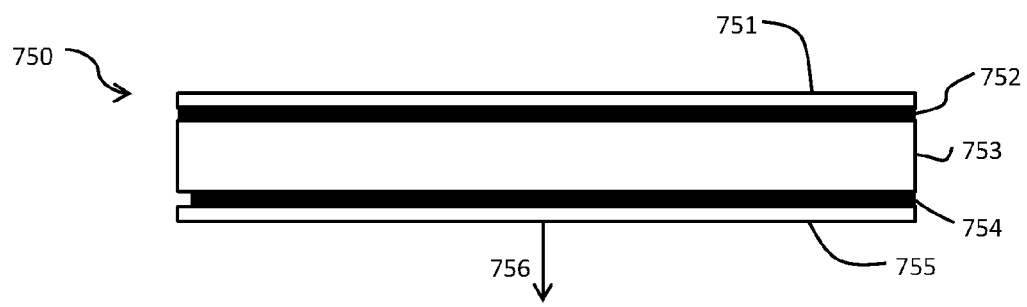

FIGS. 13A-B are illustrations of a CVD showerhead according to some embodiments of the present invention.

Figure 14:
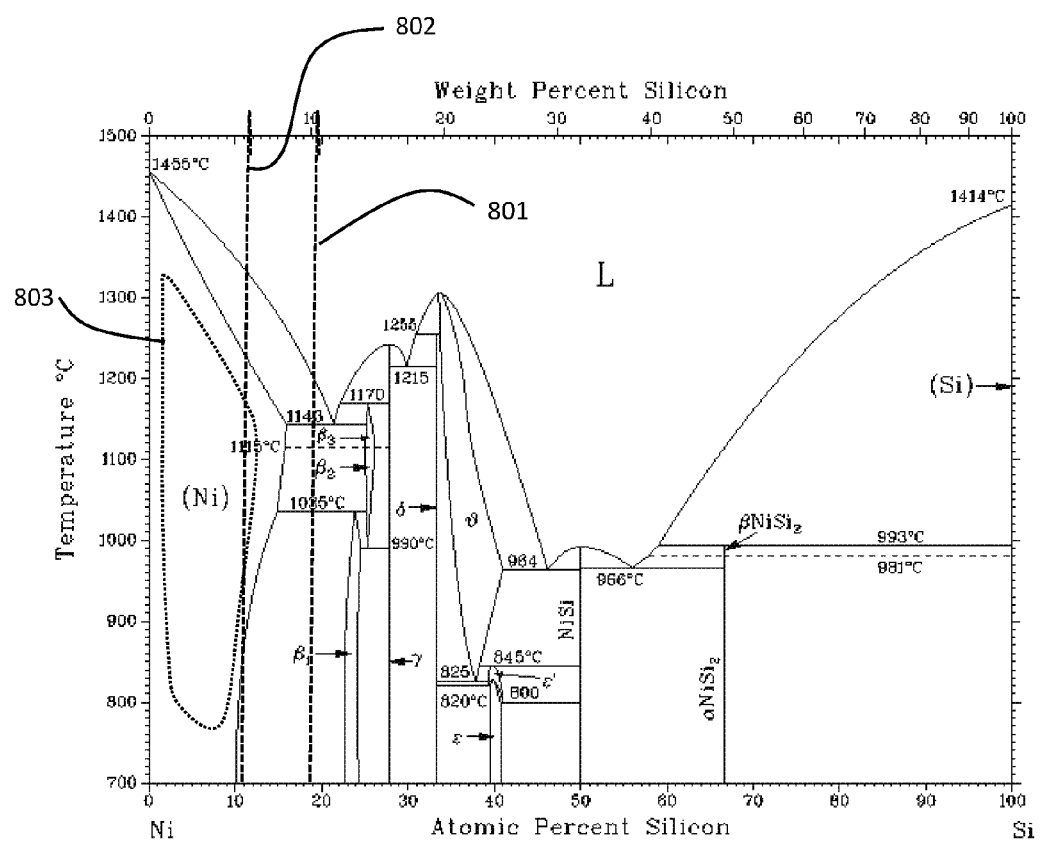

FIG. 14 is a phase diagram for Ni—Si alloys.

Figure 15:
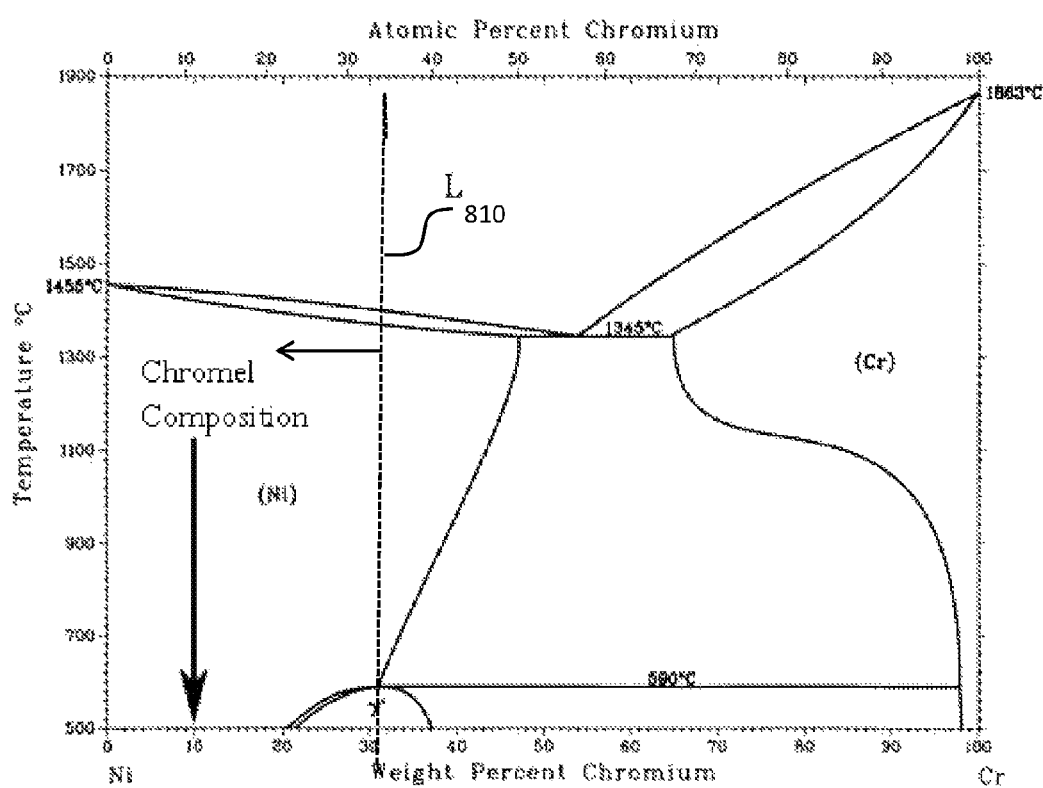

FIG. 15 is a phase diagram for Ni—Cr alloys.

Figure 16:
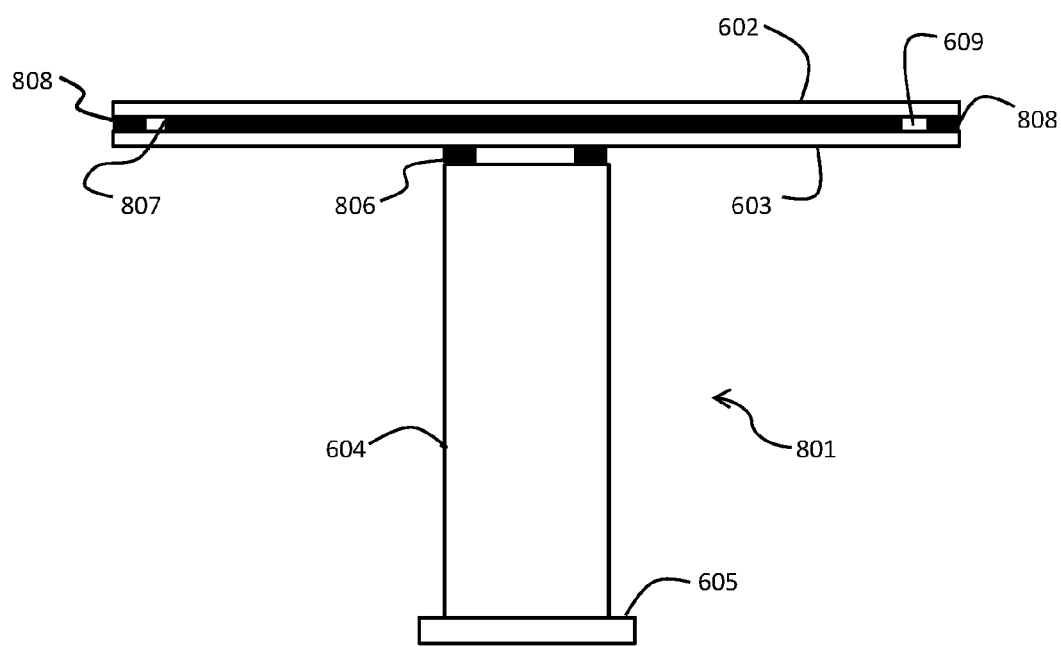

FIG. 16 is a cross-sectional view of a multi-layer plate assembly according to some embodiments of the present invention.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Some prior processes for the joining of ceramic materials required specialized ovens, and compression presses within the ovens, in order to join the materials. For example, with liquid phase sintering, two pieces may be joined together under very high temperatures and contact pressures. The high temperature liquid-phase sintering process may see temperatures in the range of 1700 C and contact pressures in the range of 2500 psi.

Other prior processes may utilize diffusion of a joining layer into the ceramic, and/or of the ceramic into the joining layer. In such processes, a reaction at the joint area may cause changes to the material composition of the ceramic in the area near the joint. This reaction may depend upon oxygen in the atmosphere to promote the diffusion reaction. In contrast to the aforementioned processes, joining methods according to some embodiments of the present invention do not depend upon liquid phase sintering.

In some applications where end products of joined ceramics are used, strength of the joint may not be the key design factor. In some applications, hermeticity of the joint may be required to allow for separation of atmospheres on either side of the joint. Also, the composition of the joining material may be important such that it is resistant to chemicals which the ceramic assembly end product may be exposed to. The joining material may need to be resistant to the chemicals, which otherwise might cause degeneration of the joint, and loss of the hermetic seal. The joining materials may also need to be of types of materials which do not negatively interfere with the processes later supported by the finished ceramic device.

In some applications, such as with an electrostatic chuck (ESC), the joining material may be used as a joining layer between plate layers and also as the RF electrode. For example, the brazing material may form a circular disc which functions as an electrode, and also as a sealing ring around the periphery of the plate assembly although electrically isolated from the electrode. In such applications the uniformity of the electrode, with regard to its RF and electrical properties, is an important parameter. For example, if the joining layer is an alloy, it may be important to have little or no compounds within the finished layer which forms the electrode that may disrupt the uniformity of the electrode layer.

In the processing of substrates, many processes require that the substrate be supported by semiconductor processing equipment components, such as a heater or an electro-static chuck. Also, other structures, such as CVD showerheads, are also used in such processes. These components may be maintained at, or required to operate in, vacuum conditions, high temperatures, thermal cycling, corrosive atmospheres, and may be damaged during their use during semiconductor manufacturing processes or otherwise. In some aspects, these components may be comprised substantially or comprised fully of a ceramic such as aluminum nitride. The manufacture of these components from such a material has involved costly materials, and is time and equipment intensive, resulting in a very expensive end product.

Prior methods of manufacturing components such as heaters and electrostatic chucks using ceramic materials have required process steps with specialized atmospheres (such as vacuum, inert, or reducing atmospheres), very high temperatures, and very high contact pressures. The contact pressures may be applied using presses, and these presses may be adapted to operate inside a process chamber that provides the specialized atmospheres, such as vacuum, and high temperatures. This may require specialized presses and fixturing made of refractory materials, such as graphite, within the process chamber. The cost and complexity of these setups may be very high. In addition, the larger the component that is required to be pressed, the fewer components can be put into such a process oven. As the duration of the processes in the process ovens with presses may be measured in days, and given the large expense associated with both the manufacture of and the running of the process ovens/presses, a reduction in the number of steps which use these process ovens which provide very high temperature, special atmospheres, and very high contact pressures during the manufacture of components will result in great savings.

Figure 1:
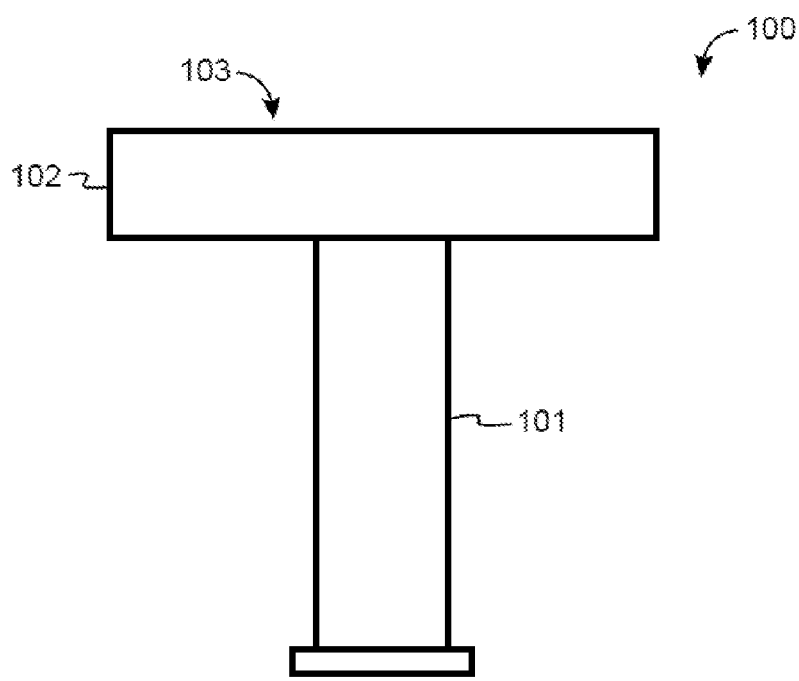
FIG. 1 is a view of a plate and shaft device used in semiconductor processing according to some embodiments of the present invention.
Figure 2:
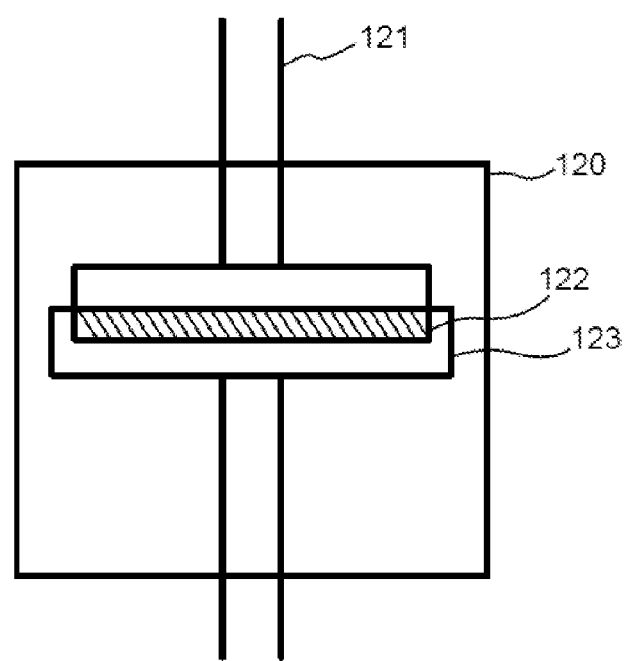
FIG. 2 is a sketch of a high temperature press and oven for a plate according to some embodiments of the present invention.

FIG. 1 illustrates an exemplary plate and shaft device 100, such as a heater, used in semiconductor processing. In some aspects, the plate and shaft device 100 is composed of a ceramic, such as aluminum nitride. Other materials, such as alumina, silicon nitride, silicon carbide or beryllium oxide, may be used. In other aspects the plate may be aluminum nitride and the shaft may be zirconia, alumina, or other ceramic. The heater has a shaft 101 which in turn supports a plate 102. The plate 102 has a top surface 103. The shaft 101 may be a hollow cylinder. The plate 102 may be a flat disc. Other subcomponents may be present. In some present processes, the plate 102 may be manufactured individually in an initial process involving a process oven wherein the ceramic plate is formed. FIG. 2 conceptually illustrates a process oven 120 with a press 121. The plate 122 may be compressed under temperature in a fixture 123 adapted to be pressed by the press 121. The formation of the plate 122 would be one of many processes needed to be performed with a very specialized process oven. The shaft 101 may also be similarly manufactured in a process step. The formation of the shaft 163 would be another of the processes needed to be performed with a very specialized process oven. In a typical process, the plate and shaft are formed by loading of aluminum nitride powder incorporating a sintering aide such as yttria at about 4 weight % into a mold, followed by compaction of the aluminum nitride powder into a "solid" state typically referred to as "green" ceramic, followed by a high-temperature liquid-phase sintering process which densifies the aluminum nitride powder into a solid ceramic body. The high temperature liquid-phase sintering process may see temperatures in the range of 1700 C and contact pressures in the range of 2500 psi. The bodies are then shaped into the required geometry by standard grinding techniques using diamond abrasives.

There are multiple functions of the shaft: one is to provide vacuum-tight electrical communication through the wall of the vacuum chamber in order to apply electrical power to heater elements as well as a variety of other electrode types which may be embedded within the heater plate. Another is to allow temperature monitoring of the heater plate using a monitoring device such as a thermocouple, and allowing that thermocouple to reside outside of the processing chamber environment in order to avoid interaction such as corrosion between the materials of the thermocouple and the process chemicals, as well as allowing the thermocouple junction to operate in a non-vacuum environment for rapid response. Another function is to provide isolation of the materials used for the previously mentioned electrical communication from the processing environment. Materials used for electrical communication are typically metallic, which could thereby interact with process chemicals used in the processing environment in ways which could be detrimental to the processing results, and detrimental to the lifetime of the metallic materials used for electrical communication.

Figure 3:
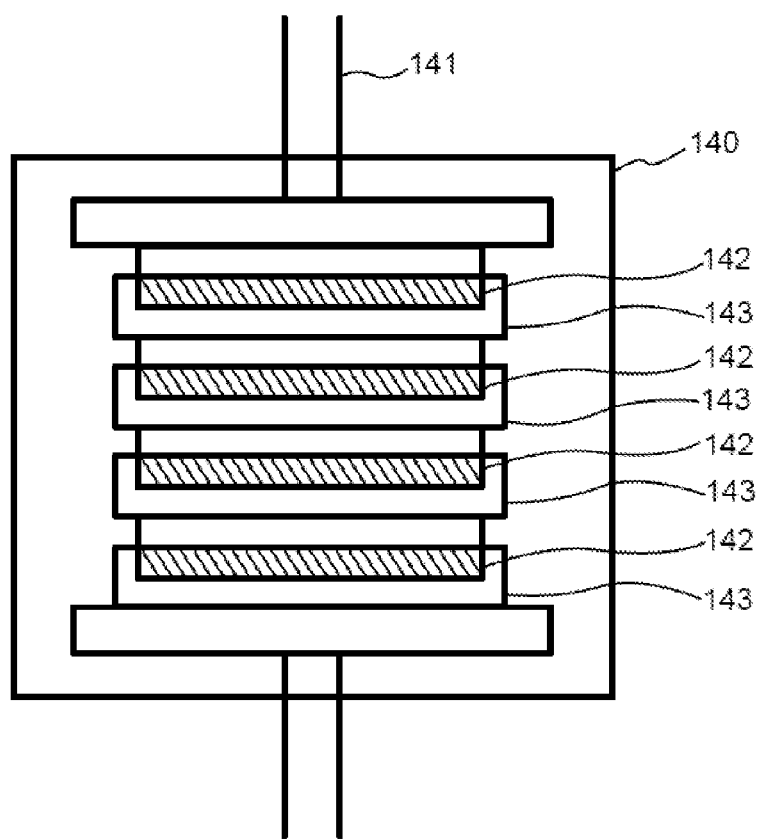
FIG. 3 is a sketch of a high temperature press and oven for a plurality of plates according to some embodiments of the present invention.

Given the relatively flat nature of the plate, a plurality of plates 142 may be formed in a single process by stacking a plurality of plate molding fixtures 143 along the axial direction of the press 141 which resides within the process oven 140, as seen conceptually in FIG. 3. The shafts may also be formed in a similar process using the press in the process oven, wherein multiple shafts are made simultaneously side by side, for example.

In the overall process of manufacturing a heater used in semiconductor processing both the step of forming plates and forming shafts require significant commitments of time and energy. Given the cost of the specialized high temperature ovens, and that the process steps of forming the plates and forming the shafts each may require the use of a specialized process oven for days, a considerable investment of both time and money has been invested just to get the overall process to the point where the shaft and plate have been completed. Yet a further step in the specialized process oven is required in present processes to affix the plate to the shaft. An example of this step would be to join the shaft to the plate using a liquid phase sintering step in the specialized high temperature process oven with a press. This third step in the specialized process oven also requires significant space in such a process oven as the assembled configuration of the heater includes both the length of the shaft and the diameter of the plate. Although the manufacture of just the shafts may take a similar amount of axial length, the diameter of the shafts is such that multiple shafts may be produced in parallel in a single process.

Figure 4:
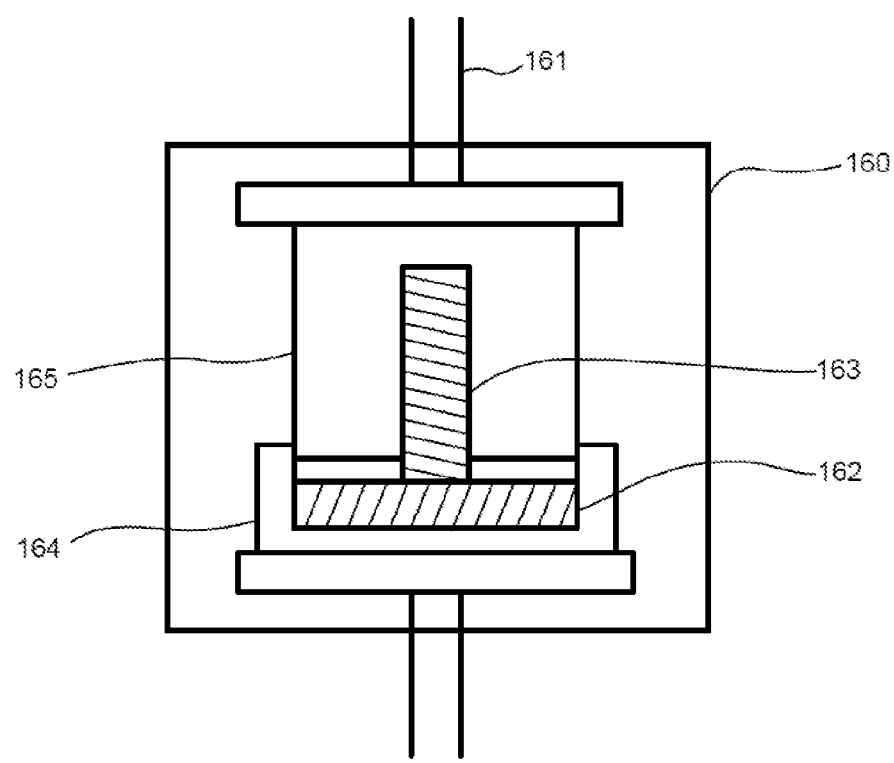
FIG. 4 is a sketch of a high temperature press and oven for a plate and shaft device according to some embodiments of the present invention.

As seen in FIG. 4, the joining process to sinter the shaft to the plate again requires the use of a process oven 160 with a press 161. A set of fixtures 164, 165 is used to position the plate 162 and the shaft 163, and to transmit the pressure delivered by the press 161. Once the heater is completed, it may be used in semiconductor processing. The heater is likely to be used in harsh conditions, including corrosive gasses, high temperatures, thermal cycling, and gas plasmas.

Another prior method for joining ceramic shafts to ceramic plates involves the bolting of the shaft to the plate. Such systems are not hermetic even where the adjoining surfaces are polished to enhance the quality of the seal. A constant positive purge gas pressure is required into the inside of the shaft to reduce process gas infiltration.

An improved method for manufacturing semiconductor processing equipment may involve the joining of a shaft and a plate, which have been described above, into a final joined assembly without the time consuming and expensive step of an additional liquid phase sintering with high temperatures and high contact pressures. The shaft and plate may be joined with a brazing method for joining ceramics. An example of a brazing method for joining together first and second ceramic objects may include the steps of bringing the first and second objects together with a Nickel alloy braze layer, heating the Nickel alloy braze layer to a temperature above its solidus temperature in vacuum, and cooling to a temperature below its melting point so that the braze layer hardens and creates a hermetic seal so as to join the first member to the second member. Depending upon the processes intended to be run with the completed ceramic piece, in the case of semiconductor processing equipment, a nickel alloy may be selected which has a solidus temperature above the process temperature, and which has a composition compatible with the processing environment. Various geometries of braze joints may be implemented according to methods described herein. In some aspects, the material to be joined is composed of a ceramic, such as aluminum nitride. Other materials, such as alumina, silicon nitride, silicon carbide or beryllium oxide, may be used. In some aspects, other ceramics, minerals, or metals may be joined.

Examples of ceramic semiconductor processing equipment which may be produced using methods according to the present invention include, but are not limited to, substrate support pedestals, electrostatic chucks, and CVD showerheads.

Figure 5A:
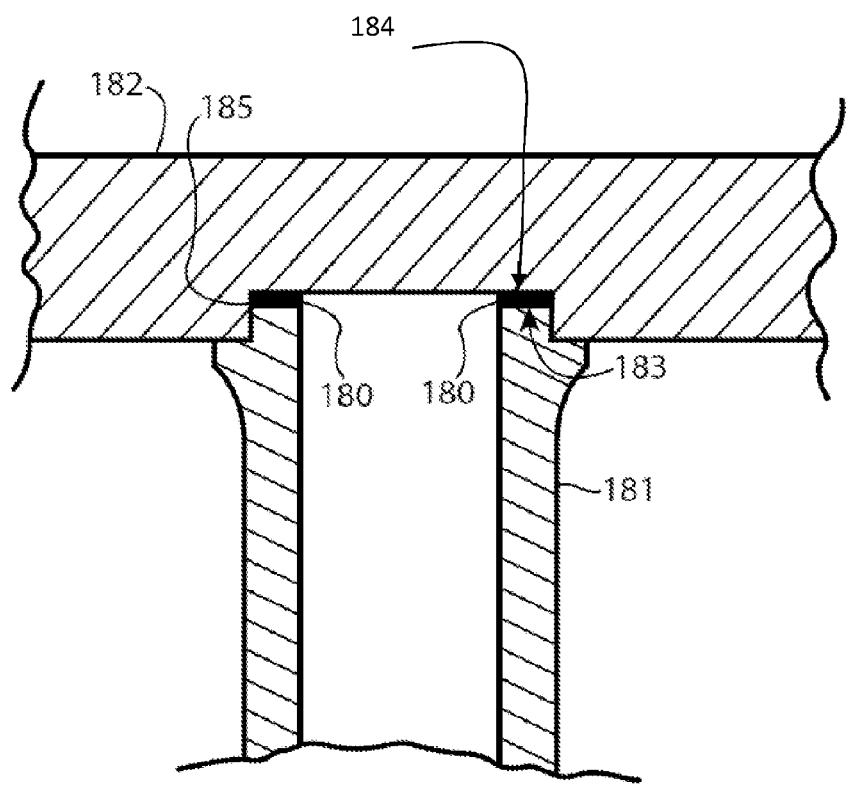
FIG. 5A is a cross-sectional view of a joint between a plate and shaft according to some embodiments of the present invention.

FIG. 5A shows a cross section of a first embodiment of a joint in which a first ceramic object, which may be a ceramic shaft 181, for example, may be joined to a second ceramic object, which may be made of the same or a different material, and which may be a ceramic plate 182, for example. A braze filler material 180 may be included, which can be selected from the combinations of braze materials or binders described herein and may be delivered to the joint according to the methods described herein. With respect to the joint depicted in FIG. 5A, the shaft 181 is positioned such that it abuts the plate, with only the braze filler interposed between the surfaces to be joined, for example end surface 183 of the end 185 of the shaft 181 and an interface surface 184 of the plate 182. The thickness of the joint is exaggerated for clarity of illustration.

Although an exemplary embodiment utilized to illustrate the joining of ceramics according to aspects of the present invention is that of joining a plate to a shaft, such as may be done when manufacturing a heater or electrostatic chuck used in semiconductor processing, it is to be understood that the joining of ceramics with nickel alloys according to aspects of the present invention is not limited to such an embodiment. The joining of ceramics with nickel alloy brazing methods as described herein is itself a novel and useful approach for the joining of ceramics.

Figure 5B:
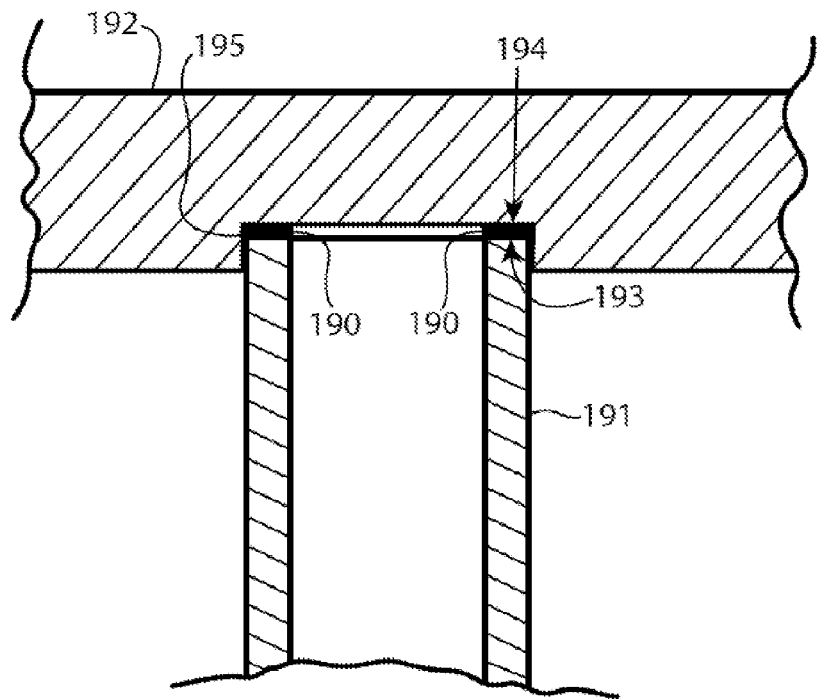
FIG. 5B is a cross-sectional view of a joint between a plate and shaft according to some embodiments of the present invention.

FIG. 5B shows a cross section of a second embodiment of a joint in which a first ceramic object, which may be a ceramic shaft 191, for example, may be joined to a second ceramic object, which may be made of the same or a different material, and which may be a ceramic plate 192, for example. A joining material, such as braze filler material 190, may be included, which can be selected from the combinations of braze materials or binders described herein and may be delivered to the joint according to the methods described herein. With respect to the joint depicted in FIG. 5B, the shaft 191 is positioned such that it abuts the plate, with only the braze filler interposed between the surfaces to be joined, for example surface 193 of the shaft and surface 194 of the plate. The interface surface 194 of the plate 192 may reside in a recess 195 in the plate. The thickness of the joint is exaggerated for clarity of illustration.

Figure 5C:
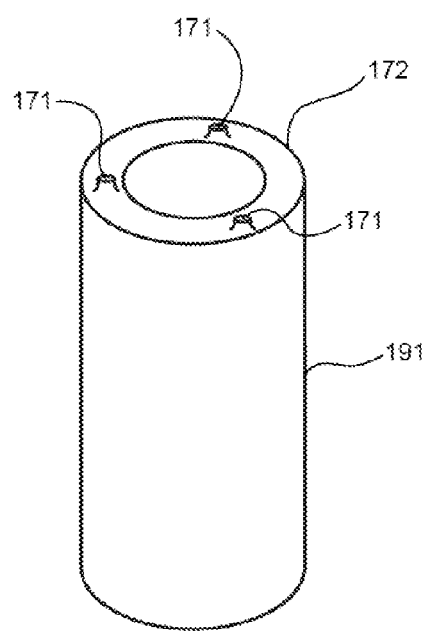
FIG. 5C is a perspective view of a shaft end with standoffs according to some embodiments of the present invention.

The embodiments as illustrated in FIGS. 5A and 5B may include a plurality of standoffs adapted to maintain a minimum braze layer thickness. In some embodiments, as seen in FIG. 5C, the shaft 191 may utilize a plurality of mesas 171 on the end 172 of the shaft 191 which is to be joined to the plate. The mesas 171 may be part of the same structure as the shaft 191, and may be formed by machining away structure from the shaft, leaving the mesas. In some embodiments, the mesas may be used to create a minimum braze layer thickness of the remainder of the shaft end 172 from the mating surface of the plate. In some embodiments, the braze filler material, prior to brazing, will be thicker than the distance maintained by the mesas between the shaft end and the plate. With appropriate tolerance control on the interface surface of the plate and of the shaft and mesas, the tolerance control of the finished plate and shaft device may be achieved as the mesas move to contact the plate interface during the brazing step. In some embodiments, other methods may be used to establish a minimum braze layer thickness. In some embodiments, ceramic spheres may be used to establish a minimum braze layer thickness.

Figure 6:
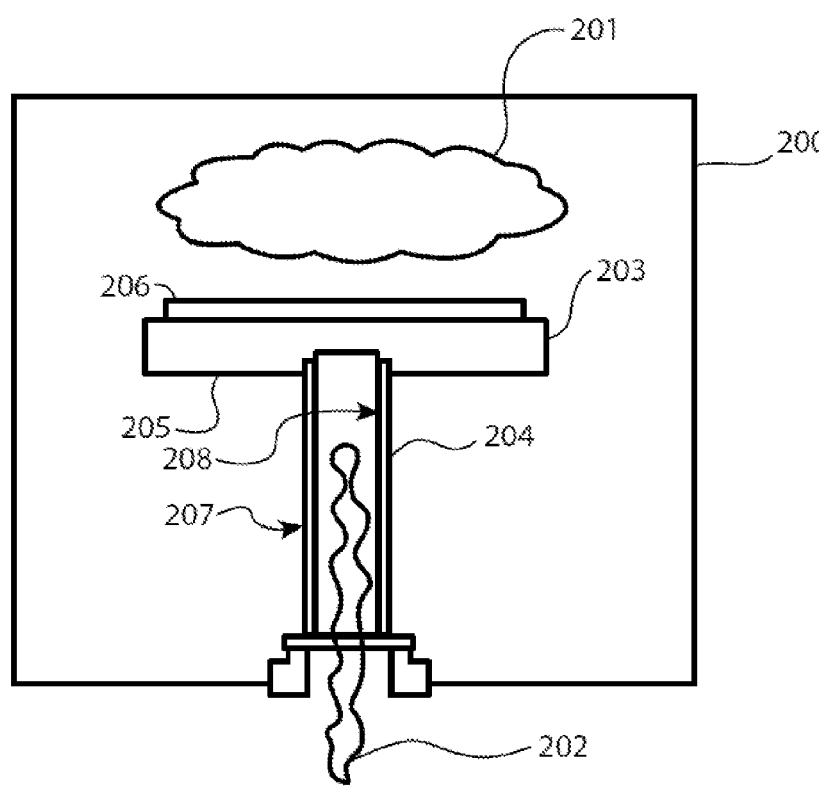
FIG. 6 is a partial cross-sectional view of a plate and shaft device in use in semiconductor manufacturing according to some embodiments of the present invention.

As seen in FIG. 6, the brazing material may bridge between two distinct atmospheres, both of which may present significant problems for prior brazing materials. On an external surface 207 of the semiconductor processing equipment, such as a heater 205, the brazing material must be compatible with the processes occurring in, and the environment 201 present in, the semiconductor processing chamber 200 in which the heater 205 will be used. The heater 205 may have a substrate 206 affixed to a top surface of the plate 203, which is supported by a shaft 204. On an internal surface 208 of the heater 205, the brazing material must be compatible with a different atmosphere 202, which may be an oxygenated atmosphere. Prior brazing materials used with ceramics may not have been able to meet both of these criteria. For example, braze elements containing copper, silver, or gold may interfere with the lattice structure of the silicon wafer being processed, and may not be appropriate. However, in the case of a brazed joint joining a heater plate to a heater shaft, the interior of the shaft typically sees a high temperature, and has an oxygenated atmosphere within the center of the hollow shaft. The portion of the braze joint which would be exposed to this atmosphere will oxidize, and may oxidize into the joint, resulting in a failure of the hermeticity of the joint. In addition to structural attachment, the joint between the shaft and the plate of these devices to be used in semiconductor manufacturing must be hermetic in many, if not most or all, uses. Hermeticity is verified by having a vacuum leak rate of <1×10E-9 sccm He/sec; as verified by a standard commercially available mass spectrometer helium leak detector.

Figure 7:
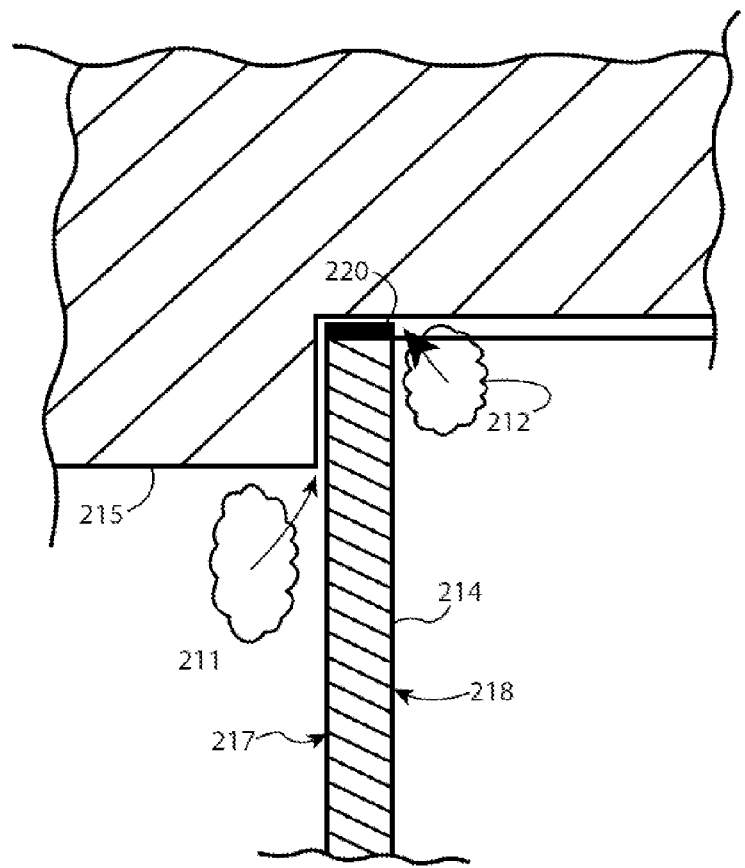
FIG. 7 is a close-up cross-sectional view of a joint between and shaft and a plate according to some embodiments of the present invention.

FIG. 7 illustrates a joint 220 used to join a plate 215 to a shaft 214 according to some embodiments of the present invention. The joint 220 has created a structural and hermetic joint which structurally supports the attachment of the plate 215 to the shaft 214. The joint 220 has created a hermetic seal which isolates the shaft atmosphere 212 seen by the interior surface 218 of the shaft 214 from the chamber atmosphere 211 seen along the exterior surface 217 of the shaft 214 and within the process chamber. The joint 220 may be exposed to both the shaft atmosphere and the chamber atmosphere and must therefore be able withstand such exposure without degradation which may result in the loss of the hermetic seal. In this embodiment, the joint may be a nickel alloy and the plate and the shaft may be ceramic such as aluminum nitride.

Figure 8:
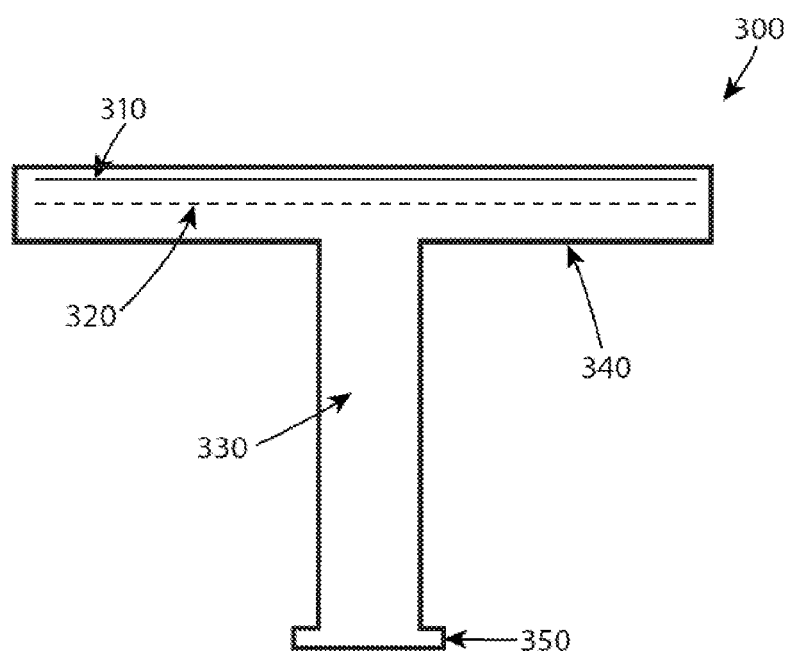
FIG. 8 is view of a plate and shaft device according to some embodiments of the present invention.

FIG. 8 shows one embodiment of a schematic illustration of a heater column used in a semiconductor processing chamber. The heater 300, which may be a ceramic heater, can include a radio frequency antenna 310, a heater element 320, a shaft 330, a plate 340, and a mounting flange 350. One embodiment of a brazing method for joining together a shaft 330 and a plate 340, both or either one of which may be made of aluminum nitride, to form the heater 300 may be implemented as follows. In some embodiments, a polycrystalline AlN is used, and is comprised of 96% AlN and 4% Yttria. Such a ceramic may be used in industrial applications because during the liquid phase sintering used to manufacture the ceramic, a lower temperature may be used. The lower temperature process, in contrast to polycrystalline AlN without a sintering aide, reduces manufacturing costs of the ceramic. The poly-crystalline AlN with added Yttria may also have preferred material properties, such a being less brittle. Yttria and other dopants are often used for manufacturability and tuning of material properties. With a polycrystalline AlN such as 96% AlN-4% Yttria ceramic, the ceramic presents grains of AlN which are interspersed with yttrium aluminate.

A braze material which will be compatible with both of the atmospheres seen on both sides across a joint in such a device is a nickel alloy with a low percentage of aluminum. The braze material may be in the form of a sheet, a powder, a thin film, or be of any other form factor suitable for the brazing processes described herein. In some embodiments, braze layers which are 0.001 to 0.010 inches thick are used. In some embodiments, a nickel alloy is used with a low percentage of aluminum, chromium, titanium, or silicon. It is understood in the art that pure nickel does not wet, or wet well, with ceramics. In applications where both strength and hermiticity are important aspects of a joint pure nickel may not be appropriate as it is not known to wet with ceramics. Some nickel alloys are known in the art, however these typically have constituents which are not resistant to fluorine chemistries seen in semiconductor processing, and also may contain compounds (phases) which interfere with uniformity of electrical properties. The braze material may join directly to a ceramic surface of the ceramic piece being joined. For example, when a nickel alloy is used to join aluminum nitride, the nickel alloy may be directly disposed onto an aluminum nitride surface of the aluminum nitride piece. In some aspects, the nickel alloy is comprised solely of nickel and one element of the group of aluminum, chromium, titanium, or silicon. In some aspects, the nickel alloy may be comprised of nickel and one or more elements of the group of aluminum, chromium, titanium, or silicon.

In some embodiments, a vacuum of lower than 1×10E-4 Torr is used. In some embodiments, a vacuum of lower than 1×10E-5 Torr is used. Of note with regard to this step is that the high temperature oven with high contact pressure fixturing, which was required during the manufacture of the ceramic components (shaft and plate), is not needed for this joining of the shaft and plate. Upon initiating the heating cycle, the temperature may be raised slowly, to standardized temperatures, for example, 60 C below the liquidus temperature, and then the joining temperature which is at least the solidus temperature, and held at each temperature for a fixed dwell time to allow the vacuum to recover after heating, in order to minimize gradients and/or for other reasons. In some aspects, the joining temperature may be at least the liquidus temperature. When the braze temperature has been reached, the temperature can be held for a time to effect the braze. In an exemplary embodiment, the dwell temperature may be at or slightly above the liquidus temperature of the selected alloy and the dwell time may be 10 minutes. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation. In some aspects, the temperature dwell time may be between 1 minute and 1 hour. In some aspects, the temperature dwell time may be between 2 minutes and 10 minutes.

In some aspects, the brazing element is brought to a temperature above the solidus temperature under a controlled atmosphere, which may be a vacuum. In some aspects, the brazing element is brought to a temperature above the melting (liquidus) temperature under a controlled atmosphere, which may be a vacuum. At the desired brazing temperature, the brazing element then flows over the substrate surfaces adjoining the filler material (wetting) and forming the basis of the desired joint. A vacuum ambient helps insure that residual gas existing in the joint region is removed insuring a more complete wetting of the joint surfaces including infusion of the liquid filler into any contours, pores, crevices, and readily accessible intergranular spaces that may exist in the surfaces of the parts comprising the final joined item.

The wetting and flow of the brazing layer may be sensitive to a variety of factors. The factors of concern include the braze material composition, the ceramic composition, the composition of the ambient atmosphere during the joining process, which includes the level of oxygen in the chamber during the joining process, the temperature, the time at temperature, the thickness of the braze material, the surface characteristics of the material to be joined, the geometry of the pieces to be joined, and the physical pressure applied across the joint during the joining process.

In some embodiments, the process oven is purged and re-filled with pure, dehydrated pure noble gas, such as argon gas, to remove the oxygen. In some embodiments, the process oven is purged and re-filled with purified hydrogen to remove the oxygen. In these examples, the brazing occurs in the very low oxygen environment with the gasses as stated above.

Figure 9:
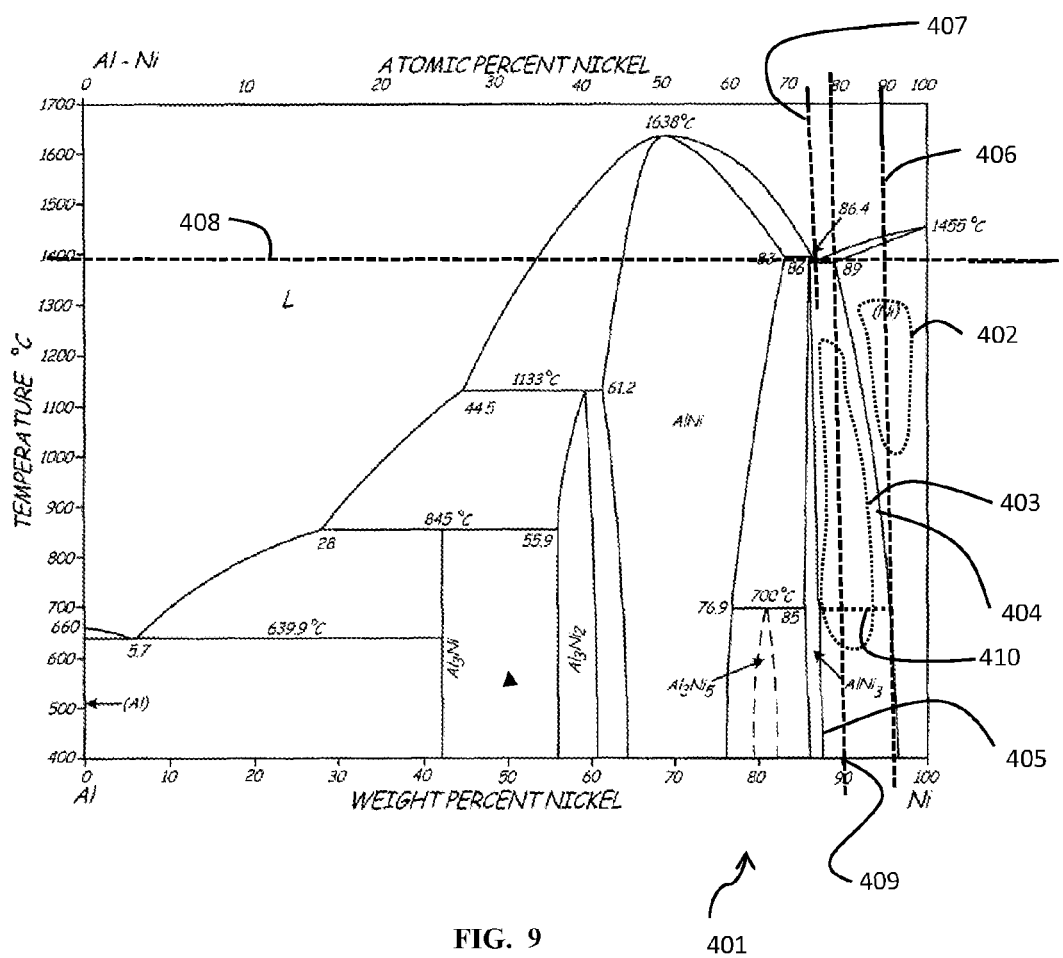
FIG. 9 is a phase diagram of nickel aluminum alloy illustrating aspects of the present invention.

FIG. 9 is a phase diagram 401 for nickel aluminum with regard to weight percent nickel and temperature. Starting at the right hand side of the diagram, one can see that in the region 402 that the predominant (or only) phase is that of nickel with aluminum in solution within it. This extends up to the 404. For alloy ratios to the right of line 406, that is Ni concentrations greater than about 96 Wt %, when brazed at temperatures above the liquidus temperature 408, which varies somewhat depending upon the percentage of aluminum in the mix, as the liquid braze material is cooled it forms nickel with interspersed aluminum, but does not form other compounds. At a nickel percentage by weight of approximately 87-96%, the braze, when cooled, forms both nickel with interspersed aluminum and also AlNi3, and this occurs within the region 403 in the overall region bounded by the lines 404 and 405. As one looks further left in the phase diagram one can see the nickel percentage (approximately 87% on the bottom Weight Percent Nickel scale) at which there is no more of the phase of nickel with aluminum interspersed created as the material cools, but only the compound Ni3Al (the region designated as AlNi3 in the phase diagram). When seeking to maintain uniform electrical properties, such as may be sought after or required for RF antennas, for example, it is sought after to maintain as much nickel phase as possible while still achieving a hermetic joint. An exemplary line 406 illustrating a range of nickel 96-100 Wt % to achieve these goals is seen on the phase diagram. FIG. 9 illustrates the equilibrium percentage of nickel interspersed with aluminum relative to Ni3Al, as would be found in the general region 403, for example. Line 410 illustrates a situation where a weight percentage ratio of nickel to aluminum as demonstrated by the vertical line 409 has been cooled down to 700 C. At this circumstance, the ratio of nickel interspersed with aluminum to Ni3Al is the ratio of the length of line 410 between line 409 and line 405 to the length of line 410 between line 409 and line 404. Using line 409 as an example, as the weight percentage ratio alloy seen at line 409 is cooled from a temperature above liquidus, first only Ni,Al solid would solidify. Then, as the temperature dropped during cooling to a temperature below the temperature at the intersection of line 404 with line 409, Ni3Al would begin precipitating out. It is understood that the phase diagrams represent equilibrium conditions and that in actuality kinetic factors may inhibit reaching these states.

When seeking to maintain uniform electrical properties, such as may be sought after or required for RF antennas, for example, it is sought after to maintain as much nickel phase as possible while still achieving a hermetic joint. An exemplary line 406 illustrating a range of nickel 96-100 Wt % to achieve these goals is seen on the phase diagram. In some aspects, an exemplary range for the Ni Al composition used to braze would be in the range of 95-97 Wt % Ni. In some aspects, the range would be 93-98.5 Wt % Ni. In some aspects, the range would be 91-100 Wt % Ni.

In some applications, an alloy composition is used which maintains as much alloying element as possible without the formation of other compounds. In some applications, a small amount of compounding elements may be desired for reasons relating to strength or other factors.

Figure 10:
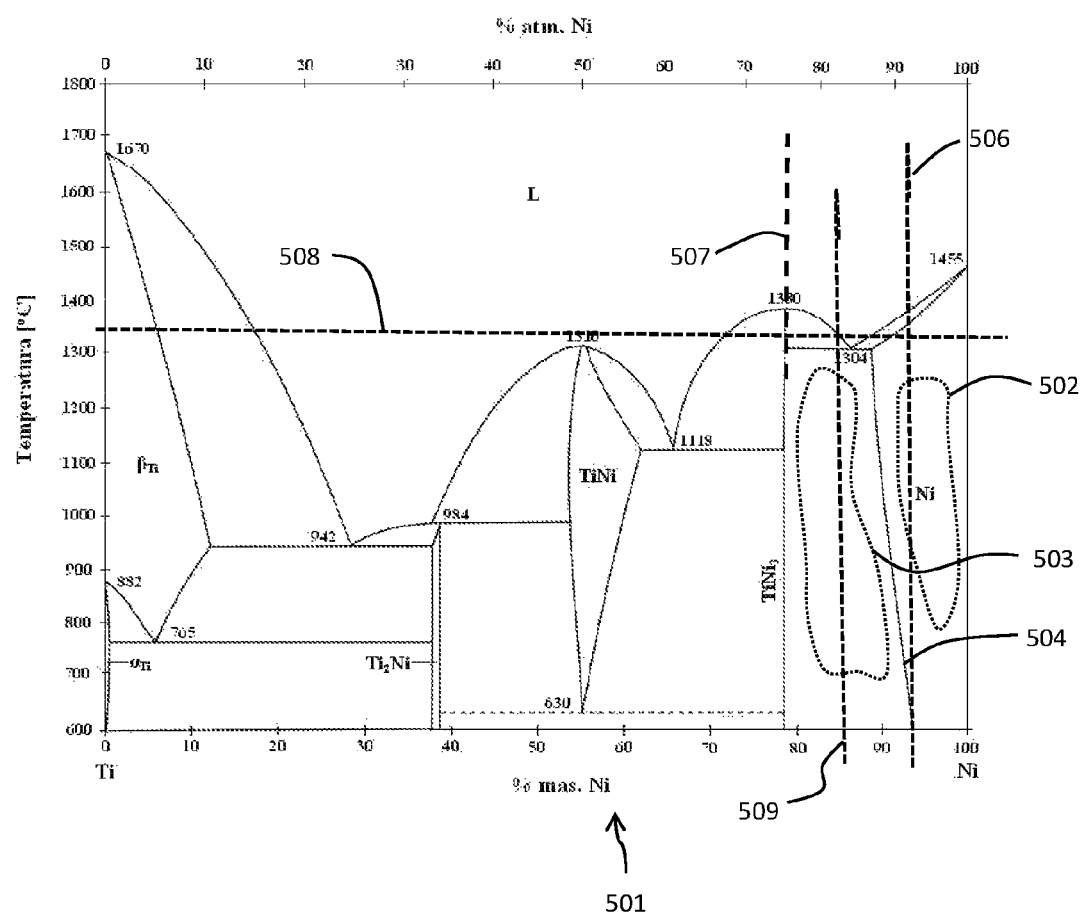
FIG. 10 is a phase diagram of nickel titanium alloy illustrating aspects of the present invention.

FIG. 10 is a phase diagram 501 for nickel titanium with regard to percent nickel and temperature. Starting at the right hand side of the diagram, one can see that in the region 502 that the predominant (or only) phase is that of nickel with titanium in solution within it. For alloy ratios from about 100 to 95 Wt % Ni in this region, when brazed at temperatures above the liquidus temperature 508, which varies somewhat depending upon the percentage of titanium in the mix, as the liquid braze material is cooled it forms nickel with interspersed titanium, but does not form other compounds. At slightly higher percentages of titanium, the braze, when cooled, forms both nickel with interspersed titanium and also TiNi3, and this occurs within the region 503 just to the left of the earlier discussed region 502, in the overall region bounded by lines 504 and 507. As one looks further left in the phase diagram one can see the nickel percentage (approximately 78% on the lower Weight Percent Nickel scale) at which there is no more of the phase of nickel with titanium interspersed created as the material cools, but only the TiNi3 phase. When seeking to maintain uniform electrical properties, such as may be sought after or required for RF antennas, for example, it is sought after to maintain as much nickel phase as possible while still achieving a hermetic joint. An exemplary line 506 illustrating a range of titanium up to a percentage to achieve these goals is seen on the phase diagram.

In some aspects, an exemplary range for the Ni Ti composition used to braze would be in the range of 96-98 Wt % Ni. In some aspects, the range would be 90-99 Wt % Ni. In some aspects, the range would be 85-100 Wt % Ni.

Figure 11:
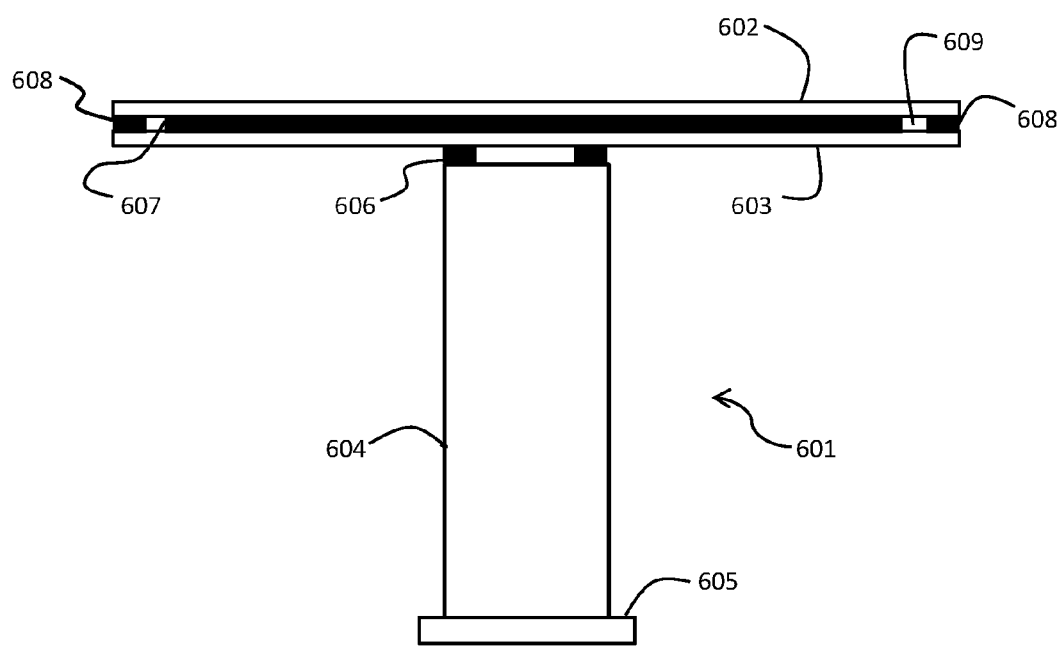
FIG. 11 is an illustrative cross-section of an electrostatic chuck according to some embodiments of the present invention.

FIG. 11 is an illustrative embodiment of a heater used in semiconductor processing according to embodiments of the present invention. In this example, a heater is constructed from a multi-layer plate assembly which is attached to a shaft. A top plate 602 and a bottom plate 603 are attached with a nickel alloy braze which is used to both create an RF antenna 607 (or other electrode device) and a circumferential sealing ring 608 which is physically separated from the sealing ring 608 by a gap 609. In some aspects, the gap 609 may also include a physical labyrinth or other feature which may prevent line of sight between the electrode and the sealing ring. In embodiments of shafted device, a shaft 604 with a base 605 may be brazed to the multi-layer plate assembly with a shaft braze seal 606. In some aspects, the shaft 604 is hollow and is adapted to allow for routing of electrical connection and/or other items up through the shaft to the bottom of the plate assembly. In an exemplary embodiment, the sealing ring 608, the electrode 607, and the shaft braze seal are all of the same nickel alloy and are all brazed in the same process step.

Separate from elements which remain in the assembly after brazing, or which form other compounds which remain in the assembly after brazing, there may be materials in the braze layer which are present only prior to the brazing process, and then evaporate or burn off during brazing. As a specific example, a binder may be used to help properly locate a Nickel alloy powder to be used as a braze layer. A binder, such as methyl cellulose mixed with a solvent, may be used to locate the powder in the desired location for the braze layer. The binder will disappear before the temperatures approach the braze temperatures. When discussing the percentages of the alloy brazing layer, the percentage after brazing, after the binder disappears, is what is viewed as the percentage of the brazing layer. For example, if a significant percentage of the pre-braze braze layer material included something such as methyl cellulose, that percentage would not be in the final braze layer after heating for brazing.

Figure 12:
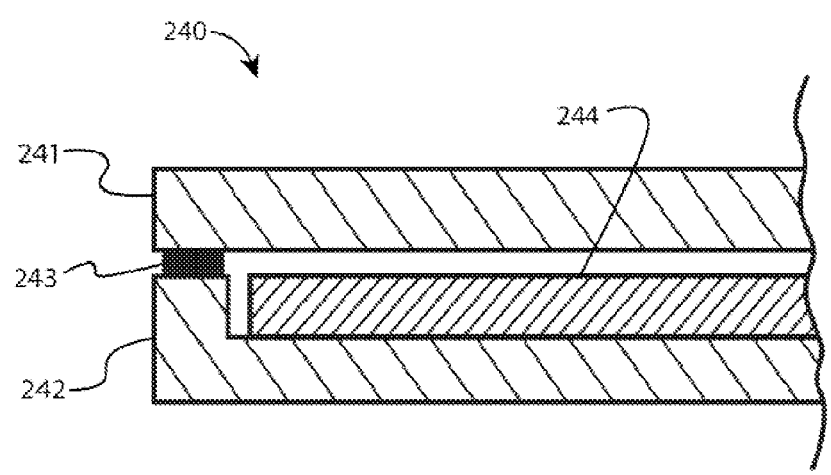
FIG. 12 is a cross-sectional view of a multi-layer plate assembly according to some embodiments of the present invention.

FIG. 12 illustrates a partial cross-section of a plate assembly according to some embodiments of the present invention. A multi-layer plate assembly is another device which may be made with the processes described herein. The plate assembly 240 may be adapted to be joined to a shaft to complete a plate and shaft assembly. The top plate layer 241 may be a circular disc adapted to support a substrate during semiconductor processing steps. A heater 244 is adapted to reside below the top plate layer 241. The heater may be attached or adhered to one or both of the plate layers. The top plate layer 241 overlays the bottom plate layer 242. A joining layer 243 joins the top plate layer 241 to the bottom plate 242. The joining layer may be an annular disc. In some embodiments, the top plate layer and the bottom plate layer are ceramic. In some embodiments, the top plate layer and the bottom plate layer are aluminum nitride. In some embodiments the joining layer is a nickel alloy selected to have nearly all of the alloying element remain in the cooled braze layer as an interstitial element.

A sheet of nickel alloy metal binder, or powder, or other type of filler may be provided between the plate layers, and between shaft and the plate. In some embodiments, the nickel alloy may be applied with sputtering techniques. In some embodiments, the nickel alloy may be applied as a powder mixed with a binder, as discussed above, and painted on. The braze layer may then be heated in a vacuum to a temperature of at least the solidus temperature of the alloy, melting the filler material and then cooled allowing the binder or filler to solidify, creating a hermetic seal joining the plate layers to each other and the shaft to the plate. In some aspects, the braze layer may then be heated in a vacuum to a temperature of at least the liquidus temperature of the alloy, melting the filler material and then cooled allowing the binder or filler to solidify, creating a hermetic seal joining the plate layers to each other and the shaft to the plate. The shaft of said heater may be of solid material or it may be hollow in conformation.

In an exemplary embodiment, the plate and shaft may both be of aluminum nitride and both have been separately formed previously using a liquid phase sintering process. The plate may be approximately 9-13 inches in diameter and 0.5 to 0.75 inches thick in some embodiments. The shaft may be a hollow cylinder which is 5-10 inches long with a wall thickness of 0.1 inches. As previously seen in FIG. 5A, the plate 182 may have a recess 185 adapted to receive an outer surface of a first end of the shaft 181. The plate 182 and shaft 181 may be fixtured together for a joining step with a brazing material 180 of nickel alloy powder placed between the pieces along the end of the shaft and within the recess of the plate. The brazing material may be 0.001 inches or greater thick prior to brazing.

Very little physical pressure, other than simple contact, may be required for joining. The low contact pressures needed for the joining of the plate to the shaft using the present methods may be able to be provided using simple fixturing, which may include a mass placed onto the fixturing using gravity to provide the contact pressure. In some embodiments, contact between the interface portion of the shaft and the brazing element, as well as contact between the interface portion of the plate and the brazing element, will provide contact pressure sufficient for joining. Thus, the fixture assembly need not be acted upon by a press separate from the fixture assembly itself. The fixtured assembly may then be placed in a process oven. The oven may be evacuated to a pressure of 1×10E-5 Torr. In some aspects, vacuum is applied to remove residual oxygen.

In some embodiments, the plate and shaft may comprise different ceramics. The plate may be adapted to provide a high conductive heat coefficient, whereas the shaft may be adapted to provide a lower conductive heat coefficient such that heat is not lost down the shaft towards the mounting appurtenances of the process chamber. For example, the plate may be made of aluminum nitride and the shaft may be made of zirconia.

In some embodiments of the present invention, as seen in FIG. 13A, a CVD showerhead 701 may be constructed out of a ceramic main body 702 and a cover 704. In some aspects the ceramic main body 702 and the cover 704 are aluminum nitride. With this multi-piece construction, the gas channels and other aspects within the showerhead may be machined into the ceramic main body 702, allowing for significant ease of construction. The cover 704 may include the holes through which the process gasses, which are routed 705 through the passages in the main body 702, leave the showerhead. The main body 702 and the cover 704 may be brazed together with a Nickel alloy joining layer 703 according to brazing techniques described above. The CVD showerhead may then be used in process applications ran at high temperatures, for example in the range of 700 C to 1000 C or more.

FIG. 13B illustrates another embodiment 750 of a showerhead with a top layer 751, which may be of ceramic, a middle layer, which may be of ceramic, and a bottom layer 755, which may be of ceramic. In some aspects all layers are aluminum nitride. A joining layer 754 may be a nickel alloy brazing layer. A second nickel alloy layer 752 may be used as an electrode in support of plasma operations or other process steps.

FIG. 14 is a phase diagram for nickel silicon with regard to percent nickel and temperature. Starting at the left hand side of the diagram, one can see that in the region 803 that the predominant phase is that of nickel with silicon within it. For alloy ratios in this region, when brazed at temperatures above the liquidus temperature, which varies somewhat depending upon the percentage of silicon in the mix, as the liquid braze material is cooled it forms nickel with interspersed silicon, but does not form other compounds other than a small percentage represented by the small region above the region 803. As seen, this occurs at a nickel percentage 802 by weight of approximately 93%. At slightly higher percentages of silicon, the braze, when cooled, forms both nickel with interspersed silicon and also other compounds, and this occurs within the region just to the right of the earlier discussed region 803. As one looks further right in the phase diagram one can see the silicon percentage, of approximately 22.5 Wt % Ni at which there is no more of the phase of nickel with silicon interspersed created as the material cools. When seeking to maintain uniform electrical properties, such as may be sought after or required for RF antennas, for example, it is sought after to maintain as much nickel phase as possible while still achieving a hermetic joint. An exemplary line 802 illustrating a range of silicon up to a percentage to achieve these goals is seen on the phase diagram. In some aspects, an exemplary range for the Ni Si composition used to braze would be in the range of 92-96 Wt % Ni. In some aspects, the range would be 91-99 Wt % Ni. In some aspects, the range would be 90-100 Wt % Ni.

FIG. 15 is a phase diagram for nickel chromium with regard to percent nickel and temperature. Starting at the left hand side of the diagram, one can see that in the far left region that the predominant (or only) phase is that of nickel with chromium within it. For alloy ratios in this region, when brazed at temperatures above the liquidus temperature, which varies somewhat depending upon the percentage of chromium in the mix, as the liquid braze material is cooled it forms nickel with interspersed chromium, but does not form other compounds, except for a very small percentage represented by the sliver seen in the phase diagram. As seen, this occurs at a nickel percentage by weight of approximately 68%. At slightly higher percentages of chromium, the braze, when cooled, forms both nickel with interspersed chromium and also a second compound, and this occurs within the region just to the right of the earlier discussed region. As one moves further right in the phase diagram there is another compound formed in addition to the phase of nickel with silicon interspersed. When seeking to maintain uniform electrical properties, such as may be sought after or required for RF antennas, for example, it is sought after to maintain as much nickel phase as possible while still achieving a hermetic joint. An exemplary line 810 illustrating a range of chromium up to a percentage to achieve these goals is seen on the phase diagram.

In some aspects, an exemplary range for the Ni Cr composition used to braze would be in the range of 60-80 Wt % Ni. In some aspects, the range would be 50-90 Wt % Ni. In some aspects, the range would be 30-99 Wt % Ni.

In some embodiments, the braze material may be a Ni—Cr—Al alloy. In some aspects, the Ni/Cr ratio is kept at 80/20 Wt fraction with an addition of Al up to 5.5 Wt %. In some embodiments, the braze material may be a Ni—Cr—Al alloy containing 20 Wt % CR, 6 Wt % Al, with a balance of Ni. These alloys will be all of substantially single phase nickel with Al and Cr in solution.

The fixtured assembly may be placed in a process oven. The oven may be evacuated to a pressure of less than 5×10E-5 Torr. In some aspects, vacuum removes the residual oxygen. In some embodiments, a vacuum of lower than 1×10E-5 Torr is used. In some embodiments, the fixtured assembly is placed within a zirconium inner chamber which acts as an oxygen attractant, further reducing the residual oxygen which might have found its way towards the joint during processing. In some embodiments, the process oven is purged and re-filled with pure, dehydrated pure noble gas, such as argon gas, to remove the oxygen. In some embodiments, the process oven is purged and re-filled with purified hydrogen to remove the oxygen.

The brazing material will flow and allow for wetting of the surfaces of the ceramic materials being joined. When ceramic such as aluminum nitride is joined using nickel alloy brazing layers and in the presence of sufficiently low levels of oxygen as described herein, the joint is a hermetic brazed joint.

Joined assemblies joined as described above result in pieces with hermetic sealing between the joined pieces. Such assemblies are then able to be used where atmosphere isolation is an important aspect in the use of the assemblies. Further, the portion of the joint which may be exposed to various atmospheres when the joined assemblies are later used in semi-conductor processing, for example, will not degrade in such atmospheres, nor will it contaminate the later semi-conductor processing. The assemblies will also be able to be used to support processing at temperatures higher than that which earlier assemblies have been able to support.

Both hermetic and non-hermetic joints may join pieces strongly, in that significant force is needed to separate the pieces. However, the fact that a joint is strong is not determinative of whether the joint provides a hermetic seal. The ability to obtain hermetic joints may be related to the wetting of the joint. Wetting describes the ability or tendency of a liquid to spread over the surface of another material. If there is insufficient wetting in a brazed joint, there will be areas where there is no bonding. If there is enough non-wetted area, then gas may pass through the joint, causing a leak. Wetting may be affected by the pressure across the joint at different stages in the melting of the brazing material. Careful control of the atmosphere seen by the brazing element during the joining process may enhance the wetting of the areas of the joint. In combination, careful control of the alloy composition, careful control of the joint thickness, and careful control of the atmosphere used during the process, may result in a complete wetting of the joint interface area that is not able to be achieved with other processes.

Another improved method for manufacturing semiconductor processing equipment using nickel may also involve the joining of a shaft and a plate, which have been described above, into a final joined assembly also without the time consuming and expensive step of an additional liquid phase sintering with high temperatures and high contact pressures. The shaft and plate may be joined with a solid state joining method for joining ceramics. An example of a method for joining together first and second ceramic objects may include the steps of putting a layer of titanium on the first and second objects, and then a thicker layer of Nickel, pressing the components together, and then heating the pieces with the layers to a temperature below the solidus temperature of nickel in vacuum, and cooling to create a hermetic seal so as to join the first member to the second member. Various geometries of braze joints may be implemented according to methods described herein. In some aspects, the material to be joined is composed of a ceramic, such as aluminum nitride. Other materials, such as alumina, silicon nitride, silicon carbide or beryllium oxide, may be used. In some aspects, other ceramics, minerals, or metals may be joined.

In an exemplary embodiment, a first ceramic piece, which may be aluminum nitride, is prepared with a thin layer of titanium, of 0.1 microns thick. The piece is then further layered with 7.5 microns of nickel. A second ceramic piece, which may be aluminum nitride, is similarly prepared. The two ceramic pieces are then put together with 20 psi of contact pressure at a joining temperature of 1200 degrees C. for 8 hours while being held at a vacuum of lower than 5×10E-5 Torr. The resulting joint hermetically seals the two ceramic pieces.

In some aspects, the titanium layer is in the range of 0.01 to 0.2 microns thick. In some aspects, the titanium layer is in the range of 0.05 to 1.5 microns thick. In some aspects, the nickel layer is in the range of 5 to 10 microns thick. In some aspects, the joining temperature is at least 1150 C. In some aspects, the joining temperature is in the range of 1150 to 1300 C.

In some embodiments, the semiconductor support structures as seen in FIGS. 5A through 7 may be manufactured using a joint joined using the solid state joining method described above. The resulting joints in such assemblies will be strong, hermetic, electrically conductive, and mechanically uniform.

FIG. 16 is an illustrative embodiment of a semiconductor support pedestal 801 used in semiconductor processing according to embodiments of the present invention. In this example, a semiconductor support pedestal is constructed from a multi-layer plate assembly which is attached to a shaft. A top plate 602 and a bottom plate 603 are attached with a nickel-titanium layer which is used to both create an RF antenna 807 (or other electrode device) and a circumferential sealing ring 808 which is physically separated from the sealing ring 808 by a gap 609. In some aspects, the gap 609 may also include a physical labyrinth or other feature which may prevent line of sight between the electrode and the sealing ring. In embodiments of shafted device, a shaft 604 with a base 605 may be joined to the multi-layer plate assembly with a shaft joint 806. In some aspects, the shaft 604 is hollow and is adapted to allow for routing of electrical connection and/or other items up through the shaft to the bottom of the plate assembly. In an exemplary embodiment, the sealing ring 808, the electrode 807, and the shaft joint 806 are all of the same material and are all brazed in the same process step. As described above, each surface of each ceramic piece which is to be joined is prepared with a Ti layer, which may be a sputtered layer, or otherwise deposited. The Ti layer may be 0.1 microns thick. A Ni layer is then layered over the Ti layer. The Ni layer is 7.5 microns thick and may be sputtered or otherwise deposited. After preparation, the assembly is configured into a final assembly configuration and subjected to contact pressure of 20 psi while heated to 1200 C for 8 hours while at a pressure of lower than 1×10E-4 Torr.

Another example of a joining method for joining ceramics using nickel, which may be used to manufacture semiconductor processing equipment, may use a titanium, a nickel, and a nickel phosphorus layer. In these embodiments, the titanium layer is used to promote adhesion, and the nickel layer is used as a seed layer as electroless nickel plating is difficult on titanium. The ENP layer provides ductility to compensate for the coefficient of thermal expansion mismatch to AlN. The ENP lowers the CTE of the nickel with the phosphorus.

The Ti—Ni-ENP w/P method described above may be viewed as a hybrid braze/diffusion bond joint. In some aspects, there may be approximately a 75% melt such that the Ti is not diffused.

In an exemplary embodiment, an aluminum nitride ceramic piece is sputtered with 0.1 microns of titanium. A nickel layer is then sputtered to a thickness of 10 microns. Then, the ENP layer with 8-13% phosphorous is applied in the range of 1000-2000 microns thick. The ENP layer is then pressed against the ENP layer of a second AlN piece which also has been similarly prepared. Using a 20 psi contact force the two pieces are pressed together at a vacuum pressure at or lower than 5×10E-5 Torr. A braze temperature of 880-940 C is used for 1-4 hours.

Semiconductor processing equipment as described herein can be manufactured using the three layer braze process described above. The joints will have significant strength and be hermetic.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for joining of ceramic pieces, the method comprising:
    applying a layer of titanium on a first ceramic piece;
    applying a layer of titanium on a second ceramic piece;
    applying a layer of nickel on each of the layers of titanium on the first ceramic piece and the second ceramic piece;
    applying a layer of nickel phosphorous to each of the layers of nickel on the first ceramic piece and the second ceramic piece;
    assembling the first ceramic piece and the second ceramic piece with the layers of titanium, nickel, and nickel phosphorous therebetween;
    pressing the layer of nickel phosphorous of the first ceramic piece against the layer of nickel phosphorous of the second ceramic piece;
    heating the first ceramic piece and the second ceramic piece, with the layers of titanium, nickel, and nickel phosphorous, to a joining temperature in a vacuum; and
    cooling the first ceramic piece and the second ceramic piece, with the layers of titanium, nickel, and nickel phosphorous,
    wherein a hermetic seal is formed between the first ceramic piece and the second ceramic piece.

2. The method according to claim 1, wherein the layers of nickel phosphorous each comprise about 8-13 wt. % phosphorous.

3. The method according to claim 1, wherein the layers of titanium are applied by sputtering.

4. The method according to claim 1, wherein the layers of nickel are applied by sputtering.

5. The method according to claim 1, wherein the layers of nickel phosphorous are applied by electroless plating.

6. The method according to claim 1, wherein the first ceramic piece and the second ceramic piece are an aluminum nitride material.

7. The method according to claim 1, wherein the layers of titanium are not diffused into each of the first ceramic piece and the second ceramic piece.

8. The method according to claim 1, wherein each of the layers of titanium are about 0.1 microns thick.

9. The method according to claim 1, wherein each of the layers of nickel are about 10 microns thick.

10. The method according to claim 1, wherein each of the layers of nickel phosphorous are about 1,000-2,000 microns thick.

11. The method according to claim 1, wherein the pressing is at about 20 psi in the vacuum at or lower than $5 \times 10E^{-5}$ Torr, at a temperature of about 880-940° C. for about 1-4 hours to create the hermetic seal.

12. The method according to claim 1, wherein the hermetic seal has a vacuum leak rate of $<1 \times 10E^{-9}$ sccm He/sec.

13. A ceramic assembly formed by the method according to claim 1.

* * * * *